United States Patent
Phan et al.

(10) Patent No.: US 12,405,223 B2
(45) Date of Patent: Sep. 2, 2025

(54) MATRIX-BASED CHARACTERIZATION AND MEASUREMENTS FOR SEMICONDUCTOR THIN-FILM MATERIAL

(71) Applicant: The Board of Trustees of the Leland Stanford Junior University, Stanford, CA (US)

(72) Inventors: Thaibao Phan, Redwood City, CA (US); Evan W. Wang, Stanford, CA (US); Jonathan A. Fan, Los Altos, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 91 days.

(21) Appl. No.: 18/034,875

(22) PCT Filed: Oct. 29, 2021

(86) PCT No.: PCT/US2021/057420
§ 371 (c)(1),
(2) Date: May 1, 2023

(87) PCT Pub. No.: WO2022/125215
PCT Pub. Date: Jun. 16, 2022

(65) Prior Publication Data
US 2024/0003819 A1      Jan. 4, 2024

Related U.S. Application Data

(60) Provisional application No. 63/115,476, filed on Nov. 18, 2020, provisional application No. 63/108,164, filed on Oct. 30, 2020.

(51) Int. Cl.
*G01N 21/84* (2006.01)
*G01J 4/02* (2006.01)
(Continued)

(52) U.S. Cl.
CPC ............. *G01N 21/8422* (2013.01); *G01J 4/02* (2013.01); *G01N 21/21* (2013.01); *G01N 21/95* (2013.01)

(58) Field of Classification Search
CPC ........... G01N 21/6458; G01N 21/6452; G01N 21/6456; G01N 2021/6421; G01N 21/45;
(Continued)

(56) References Cited

U.S. PATENT DOCUMENTS

| | | | |
|---|---|---|---|
| 4,306,809 A | 12/1981 | Azzam | |
| 6,134,011 A * | 10/2000 | Klein | G01N 21/211 250/225 |

(Continued)

FOREIGN PATENT DOCUMENTS

| | | | | |
|---|---|---|---|---|
| KR | 20050096117 A | * | 10/2005 | |
| WO | WO-2007111508 A1 | * | 10/2007 | G01B 9/02028 |

OTHER PUBLICATIONS

USPTO. International Search Report and Written Opinion dated Jun. 14, 2022 for parent PCT Application No. PCT/US2021/057420, 8 pages.

(Continued)

*Primary Examiner* — Michael P Stafira
(74) *Attorney, Agent, or Firm* — Crawford Maunu PLLC (57) ABSTRACT

Certain examples are directed to methods for detection of anomalies in semiconductor thin-film materials, such as strains, defects and the like, that may precipitate defects in semiconductor processing steps and may adversely impact device and system-level functionality, processing, and yields. Certain methods use filtering optics to provide a set of filter-separated light beams respectively associated with different polarization states of polarized light directed towards a semiconductor-related material sample, and providing a set of sample-characterizing response data based on (Continued)

factors such as sets of polarization-state values, different wavelengths associated with the polarization states, and/or light-incidence angles characterizing separation of the different polarization states. Based on these factors, the types and severities of such anomalies may be analyzed and the related defects remedied.

20 Claims, 8 Drawing Sheets

(51) Int. Cl.
*G01N 21/21* (2006.01)
*G01N 21/95* (2006.01)

(58) Field of Classification Search
CPC ............ G01N 21/6428; G01N 21/956; G01N 21/9501; G01N 21/7703; G01N 21/8806; G01N 2021/7779; G01N 2021/458; G01N 21/553; G01N 21/4795; G01N 21/648; G01N 21/8851; G01N 2201/0697; G01N 2021/4166; G01N 21/64; G01N 21/6486; G01N 2201/06113; G01N 2201/068; G01N 2201/0683; G01N 2201/0846; G01N 2201/10; G01N 2201/12; G01N 21/6454; G01N 2201/0638; G01N 2021/6419; G01N 2021/6471; G01N 21/65; G01N 2021/6439; G01N 21/47; G01N 21/658; G01N 2021/6484; G01N 21/01; G01N 21/55; G01N 2201/06146; G01N 2201/062; G01N 2201/0631; G01N 2201/0686; G01N 2021/4173; G01N 2021/6441; G01N 2021/8835; G01N 21/95623; G01N 27/447; G01N 33/48721; G01N 33/54373; G01N 2021/4709; G01N 2021/4711; G01N 2021/8854; G01N 21/21; G01N 21/25; G01N 21/41; G01N 21/8422; G01N 2201/0635; G01N 2201/1045; G01N 27/44721; G01N 2021/6463; G01N 21/27; G01N 2201/02; G01N 1/4077; G01N 15/0612; G01N 2001/4088; G01N 2015/019; G01N 2021/1776; G01N 2021/213; G01N 2021/258; G01N 2021/3177; G01N 2021/575; G01N 2021/7716; G01N 2021/7763; G01N 21/211; G01N 21/251; G01N 21/255; G01N 21/31; G01N 21/3504; G01N 21/39; G01N 21/4133; G01N 21/4738; G01N 21/4785; G01N 21/4788; G01N 21/554; G01N 21/57; G01N 21/6408; G01N 21/95; G01N 21/95607; G01N 2201/06126; G01N 2201/063; G01N 2201/0633; G01N 27/129; G01N 31/223; G01N 33/54386; G01N 2015/1006; G01N 2021/0112; G01N 2021/0346; G01N 2021/1765; G01N 2021/1772; G01N 2021/416; G01N 2021/432; G01N 2021/4733; G01N 2021/4735; G01N 2021/479; G01N 2021/4792; G01N 2021/6415; G01N 2021/6417; G01N 2021/6482; G01N 2021/7713; G01N 2021/7759; G01N 2021/7776; G01N 2021/8822; G01N 2021/8845; G01N 2035/00237; G01N 2035/00326; G01N 2035/00495; G01N 2035/00881; G01N 2035/1051; G01N 2035/1076; G01N 21/17; G01N 21/474; G01N 21/51; G01N 21/552; G01N 21/636; G01N 21/6445; G01N 21/77; G01N 21/7743; G01N 21/78; G01N 21/94; G01N 2201/0628; G01N 23/207; G01N 2333/165; G01N 2800/52; G01N 31/227; G01N 33/18; G01N 33/48707; G01N 33/531; G01N 33/56983; G01N 35/00; G01N 35/00584; G01N 35/0092; G01N 35/0099; G01N 35/085; G01N 35/1009; G01N 35/1065; G01B 11/2441; G01B 11/2513; G01B 9/04; G01B 11/14; G01B 11/25; G01B 9/02; G01B 9/02027; G01B 9/02042; G01B 11/24; G01B 11/22; G01B 9/02091; G01B 11/30; G01B 11/0608; G01B 11/254; G01B 2290/70; G01B 9/0203; G01B 9/02097; G01B 9/027; G01B 11/245; G01B 11/2545; G01B 9/02001; G01B 9/02081; G01B 11/026; G01B 11/26; G01B 11/303; G01B 11/306; G01B 2210/50; G01B 9/02004; G01B 9/02015; G01B 9/02032; G01B 9/02043; G01B 9/02044; G01B 9/02047; G01B 9/02055; G01B 9/02072; G01B 9/02077; G01B 9/02085; G01B 9/02098; G01B 11/00; G01B 11/2504; G01B 11/2518; G01B 2290/45; G01B 9/02014; G01B 9/02037; G01B 9/02041; G01B 9/02056; G01B 9/02061; G01B 9/02069; G01B 9/02084

See application file for complete search history.

(56) References Cited

U.S. PATENT DOCUMENTS

| | | | |
|---|---|---|---|
| 6,175,412 | B1 | 1/2001 | Drevillon |
| 8,405,830 | B2 | 3/2013 | Cattelan et al. |
| 9,976,906 | B2 * | 5/2018 | Ma .............................. G01J 4/04 |
| 10,732,515 | B2 * | 8/2020 | Atkins ..................... G03F 7/705 |
| 10,788,766 | B2 * | 9/2020 | Goorden ................ G03F 9/7084 |
| 2016/0356956 | A1 * | 12/2016 | Davoine ............ G02B 27/4272 |
| 2018/0066991 | A1 * | 3/2018 | Mueller .................. H01Q 21/24 |
| 2019/0094711 | A1 * | 3/2019 | Atkins .................. G01N 21/211 |

OTHER PUBLICATIONS

Dennis H. Goldstein, "Mueller matrix dual-rotating retarder polarimeter," Appl. Opt. 31, 6676-6683 (1992).
P.S. Hauge, "Automated Mueller matrix ellipsometry," Optics Communications, vol. 17, Issue 1, 74-76 (1976). Abstract Only.
J. Larry Pezzaniti and Russell A. Chipman "Mueller matrix imaging polarimetry," Optical Engineering 34(6), (Jun. 1, 1995).
Blandine Laude-Boulesteix, Antonello De Martino, Bernard Drevillon, and Laurent Schwartz, "Mueller polarimetric imaging system with liquid crystals," Appl. Opt. 43, 2824-2832 (2004). Abstract Only.
Matthieu Dubreuil, Sylvain Rivet, Bernard Le Jeune, and Jack Cariou, "Snapshot Mueller matrix polarimeter by wavelength polarization coding," Opt. Express 15, 13660-13668 (2007).
Michael W. Kudenov, Michael J. Escuti, Nathan Hagen, Eustace L. Dereniak, and Kazuhiko Oka, "Snapshot imaging Mueller matrix polarimeter using polarization gratings," Opt. Lett. 37, 1367-1369 (2012).
Aas, Lars Martin Sandvik, Pål Gunnar Ellingsen, and Morten Kildemo. "Near infra-red Mueller matrix imaging system and (56) References Cited

OTHER PUBLICATIONS application to retardance imaging of strain." Thin Solid Films 519.9 (2011): 2737-2741. Filed as Appendix 1 in priority U.S. provisional application.

Collins, R. W., and Joohyun Koh. "Dual rotating-compensator multichannel ellipsometer: instrument design for real-time Mueller matrix spectroscopy of surfaces and films." JOSA A 16.8 (1999): 1997-2006. Filed as Appendix 2 in priority U.S. provisional application.

Du, E., et al. "Mueller matrix polarimetry for differentiating characteristic features of cancerous tissues." Journal of biomedical optics 19.7 (2014): 076013-076013. Filed as Appendix 3 in priority U.S. provisional application.

Phan, Thaibao, et al. "High-efficiency, large-area, topology-optimized metasurfaces." Light: Science & Applications 8.1 (2019): 48. Filed as Appendix 4 in priority U.S. provisional application.

Tuchin, Valery & Myllylä, Risto. (2005). Chapter 29 of Handbook of Coherent Domain Optical Methods: Biomedical Diagnostics, Environmental and Material Science, pp. 1175-1252, Journal of Biomedical Optics—J Biomed Opt. 10. 10.

\* cited by examiner

MATRIX-BASED CHARACTERIZATION AND MEASUREMENTS FOR SEMICONDUCTOR THIN-FILM MATERIAL

FEDERALLY-SPONSORED RESEARCH AND DEVELOPMENT

This invention was made with Government support under contract FA9550-18-1-0070 awarded by the Air Force Office of Scientific Research and under contract N00014-20-1-2105 awarded by the Office of Naval Research. The Government has certain rights in the invention.

BACKGROUND

Aspects of the present disclosure are related generally to the observation and detection of defects and anomalies associated with manufacturing and processing of semiconductor, and more particularly in connection with thin films of materials used in semiconductors.

Semiconductor manufacturing and processing for electronic and optoelectronic components are the bases for many types of industries involved in a wide variety of technologies and businesses. Due to various factors, including the expenses associated with the manufacturing process and limited availability of many materials used in the manufacture of certain materials, there has been extensive research on how to best detect and minimize defects and related anomalies that may lead to semiconductor defects.

Examples of potential/actual defects include, among many others, incongruities such as microscopic incongruities (e.g., point defects and fractures) in the materials used in the semiconductor devices and in structures developed during various stages of semiconductor manufacturing and processing, and these so-called incongruities include both tolerable and intolerable defects. Within semiconductor thin-film materials, examples of defect types are structural inhomogeneities, stacking faults, climb and screw dislocations, helical dislocations, dislocation loops and oxygen precipitates, swirl defects, defects such as caused by temperature and material gradients and grain boundary dislocations, and chemical inhomogeneities formed due to processing or due to the materials not being pure (e.g., an external impurity or the material being a compound material).

With regards to incongruities in thin-film structures developed during various stages of semiconductor manufacturing and processing, there are many examples of anomalies that cause and/or may lead to semiconductor defects. As just a few specific examples in the context of structures developed during the manufacturing processes, anomalies known to cause and/or lead to possible and actual defects in semiconductors include: surface-related processing defects resulting from wafer processes (e.g., polishing, oxidation, and chemical etching); varying degrees of oxygen and other impurities picked up during manufacturing which may impact performance and durability specifications of the semiconductors at issue; and strain (including but not limited to stress) such as device-operational strain and manufacturing process-induced strain.

Regardless of the type and/or severity of such non-ideal anomalies, because each may precipitate defects in semiconductor processing steps and may adversely impact device and system-level functionality, processing, and yield, detection of such anomalies has become an important ongoing endeavor.

SUMMARY OF VARIOUS ASPECTS AND EXAMPLES

Various examples/embodiments presented by the present disclosure are directed to issues such as those addressed above and/or others which may become apparent from the following disclosure. For example, aspects disclosed herein are directed to methods for detecting defects and related anomalies, such as those discussed above, in an efficient and accurately manner.

More particular aspects of the present disclosure are directed to overcoming such challenges and/or combining some of the above-described aspects via Mueller polarimetry processing such as by use of a Mueller polarimeter which is capable of snapshot imaging as may be used in connection with semiconductor thin-film measurements and related semiconductor processing to advantage the manufacture of materials and structures used in semiconductors, including electrical component or physically-integrated components.

In one example embodiment, a method for detection of anomalies in semiconductor thin-film materials, involves using filtering optics to provide a set of filter-separated light beams respectively associated with different polarization states of polarized light directed towards a sample of semiconductor thin-film material; and then providing a set of sample-characterizing response data, which characterizes the sample of semiconductor thin-film material, based on (e.g., two or more of) the following factors: (a) sets of polarization-state values respectively associated with the filter-separated ones of the different polarization states, (b) different wavelengths associated with the different polarization states, and/or (c) incidence angles of light arising or caused by further processing of the filter-separated ones of the different polarization states.

Once this characterization data is obtained, the data may be analyzed to assess the semiconductor thin-film material including characterizing and better understanding the nature of its anomalies and/defects.

The above discussion is not intended to describe each aspect, embodiment or every implementation of the present disclosure. The figures and detailed description that follow also exemplify various embodiments.

BRIEF DESCRIPTION OF FIGURES

Various example embodiments, including experimental examples, may be more completely understood in consideration of the following detailed description in connection with the accompanying drawings, each in accordance with the present disclosure, in which.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to methods and systems involving optics systems and polarimetry measurements in connection with semiconductor thin-film materials and manufacture, for example, by using such optics and related light processing through which a light-characterizing mathematical matrix is acquired in a single shot. In accordance with certain example aspects of the present disclosure, an apparatus is used to for acquiring the matrix at all points on a given semiconductor thin-film material sample that may be material initially introduced for use in a semiconductor process and/or may be material developed from one or more steps involved in a semiconductor manufacturing process. The following discussion refers to certain specific illustrations of optical systems and optical-related structures in connection with certain experimental and/or proof of concept example apparatuses as discussed and/or illustrated further below by use of a Mueller matrix, for providing an exemplary context to help explain such aspects, which according to the present disclosure, are directed to detection of such anomalies that may precipitate defects in semiconductor processing steps and may adversely impact device and system-level functionality, processing, and yield.

Certain more-detailed, experimental examples of the present disclosure are directed to methods involving measurements of semiconductor thin-film material samples via polarimetry, optics, and/or light processing. In polarimetry, the Mueller matrix of a sample fully describes the effect on the polarization state of light that passes through or reflects off the sample. These effects can take the form of properties such as birefringence, depolarization, or optical activity. The optical properties can be further interpreted as physical properties. As such the Mueller matrix is a powerful tool, but the information the Mueller matrix contains comes at a high cost: sixteen independent measurements at every point are required to reconstruct the Mueller matrix of a sample. Traditional Mueller matrix polarimeters take these measurements sequentially through a set of rotating waveplates and often only at a single point, necessitating scanning over a sample to construct an image. Modern polarimeters often utilize some form of Fourier domain signal processing and fast polarization modulators to speed up the process. Even more advanced designs may possess either imaging or snapshot behavior.

In connection with the below discussion of more-detailed, experimental examples, certain aspects of the present disclosure overcome or mitigate these above-noted disadvantages. As an example and according to a detailed aspect of the present disclosure, such optical processing using a Mueller matrix may be used to characterize an integrated circuit, by way of a semiconductor thin film sample therein, relative to a model of the material or thin film structure, wherein one or more images characterizes light through or reflected from the sample. Accordingly, this type of method has been found useful for detection of stresses and/or defects in semiconductor material and semiconductor thin films used in integrated circuits (e.g., an electrical component or physically-integrated components).

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same connotation and/or reference numerals may be used in different diagrams to refer to the same or similar elements (e.g., serving similar purposes and/or to depict additional instances of the same/similar element unless indicated otherwise); an example in this regard are the light sources of FIG. 1B, FIG. 1C and FIG. 10A respectively depicted as 110, 110' and 110". Also, although aspects and features may in some cases be described in individual figures, it will be appreciated that aspects and features from one figure or example embodiment can be combined with features of another figure or embodiment even though the combination is not explicitly shown or explicitly described as a combination.

Consistent with the above aspects, such a manufactured device or method of such manufacture may involve aspects presented in U.S. Provisionals, Application Ser. No. 63/108,164 filed on Oct. 30, 2020 (STFD.424P1) and Application Ser. No. 63/115,476 filed on Nov. 18, 2020 (STFD.428P1), to which priority is claimed. To the extent permitted, such subject matter is incorporated by reference in its entirety generally and to the extent that further aspects and examples (such as experimental and/more-detailed embodiments) may be useful to supplement and/or clarify.

In certain more specific aspects according to the present disclosure, methodology and structure are implemented to provide single-snapshot imaging via a Mueller polarimeter system. Such a polarimeter system is advantageously used for instantaneously capturing the Mueller matrix across an entire sample of semiconductor materials such as thin-films, and to provide truly real-time access to the valuable information stored in the Mueller matrix with profound impacts in the above fields.

In related aspects, the present disclosure concerns apparatuses directed to such systems, and devices made by such systems and/or assemblies, and as may be used to manufacture and assess semiconductor materials and structures in connection with semiconductor processing for semiconductor electronic devices such as in integrated circuit (IC) chips and the like. Such processing includes, as non-limiting examples, thin-film measurements and analysis of thin-layer and thin-film materials to improve/assess such semiconductor manufacture and including targeted IC devices and structures which are completely and/or partially manufactured.

One such example concerns a method for detection of anomalies in semiconductor thin-film materials. The method involves use of filtering optics to provide a set of filter-separated light beams respectively associated with different polarization states of polarized light directed towards a sample of semiconductor thin-film material; and then providing a set of sample-characterizing response data, which characterizes the sample of semiconductor thin-film material, based on (e.g., two or more of) the following factors: (a) sets of polarization-state values respectively associated with the filter-separated ones of the different polarization states, (b) different wavelengths associated with the different polarization states, and/or (c) incidence angles of light arising or caused by further processing of the filter-separated ones of the different polarization states. Once this characterization data is obtained, the data may be analyzed to assess the semiconductor thin-film material including characterizing and better understanding the nature of its anomalies and/or defects.

In connection with further specific examples, such an approach is directed to the fast acquisition of a mathematical matrix (e.g., Mueller matrix) in semiconductor thin-film measurements for characterization of semiconductor-related thin-film material's response on polarized light (for example, at all points on a sample). Such fast acquisition of a mathematical matrix as in semiconductor thin-film measurements may be instantaneous or almost instantaneous. One such aspect is directed to the acquisition of such a matrix (e.g., the Mueller matrix) at any and/or all points on a sample of semiconductor material or structure in accordance with or via a single image capture.

Once the Mueller matrix is computed and images processed, various types of output may be used for analyzing and assessing anomalies such as impurities, defects, and the like. For example, such processed output may be compared with similarly obtained output data from an expected semiconductor thin-film material sample, thereby having a comparison threshold and reference for accepting and rejecting samples during the manufacturing process by use of one or more such exemplary polarimetry measurement systems as described herein.

Exemplary aspects of the present disclosure are directed to methods and apparatuses involving use of filtering optics to provide a set of filter-separated light beams respectively associated with different polarization states of polarized light directed towards a sample of semiconductor-related thin-film material; and providing a set of sample-characterizing response data based on one, two or more factors from among the following: sets of polarization-state values, different wavelengths associated with the polarization states, and light-incidence angles characterizing separation of the different polarization states. Advantageously and as useful for any of a variety of applications, more-specific example may involve image-capturing such incidence angles of light in real time via a single image capture.

Consistent with the above-discussed aspects, further aspects of the present disclosure may relate to or build on such approaches. For example, such methodology may use a system that include a light source as illumination for the at least one polarized light beam and/or a polarization-state generator (PSG) to provide the polarized light beam or beams into different channels. Such a PSG may include an optical cavity to filter, by selection, a set of wavelength channels from an output of a broadband light source. The PSG may also be configured and/or used to provide the polarized light beams in sets of light beams, each of which has a different wavelength and a polarization associated with the different wavelength, and the polarized light output from the PSG may be characterized via a set of light beams, via Stokes vectors (e.g., four such vectors), and/or with polarizations to minimally optimize a mathematical matrix descriptive of all the Stokes vectors.

In a more specific example, a broadband light source may act as a light source for multiple polarizations corresponding to the polarized light directed towards the thin-film sample, and optical elements such as a linear polarization filter and multi-order waveplates may be included to further process light in respective wavelength channels. The multi-order waveplates may be configured to further process light in respective wavelength channels that are associated with respective polarization states of the polarized light, and the respective polarization states may be characterized in that in a Poincare sphere they form a tetrahedron.

As other optional, more-specific aspects building on the above discussion, such types of systems and methods may involve mathematical characterization of the response data. In one example, the matrix may involve the set of characterizing response data for the semiconductor-related thin-film material being sufficient to compute or populate a mathematical matrix for light-response characterization of the sample in response to the at least one polarized light passing through and/or reflecting from the sample. In other such examples, the mathematical matrix is a Mueller matrix, and such methodology may further include computing the Mueller matrix across an entire image, with the image being captured in response to using filtering optics (e.g., metasurface polarization filtering to provide the set of filter-separated light beams). In another related example, the sets of polarization-state values may correspond to or are associated with Stokes vectors as noted above. Further, the filtering optics may include use of four polarization-selective metasurfaces adjacent to each other (e.g., on a single substrate), wherein each of the metasurfaces is sufficiently small so that the at least one polarized light impinges on all of the four polarization selective metasurfaces concurrently.

As may be useful, for example, in connection with a system directed to or including a logic circuit (such a computer processor circuit or CPU), for characterizing a sample in response to polarized light directed towards the sample, the apparatus and/or method may involve or use a non-transitory data-storage medium including a set of response data which characterizes the semiconductor-related thin-film material based on one, two or more of the above factors. Such a non-transitory data-storage medium may take many forms (e.g., memory internal to CPU, memory plugs, memory chips, etc.) as is typical in memory-storage systems, circuits and devices configured to store data for access (reads and/or writes) via a logic circuit. In connection with the above-discussed mathematical expressions and related response data, the logic circuit may be configured (or programmed) to compute and/or populate such a matrix.

Further, the non-transitory data-storage medium, implemented as one or multiple memories, may include another set of data associated with a set of computer-instructions (or computer directing instructions). Such a data set may be used by a computer in connection with a variety of data processing activities, such as, but not limited to, the mathematical characterizations of the response data noted above concerning a Mueller matrix, organizing the sample-responsive data, identifying a specific sample from the characterized data, etc.

Figure 1A:
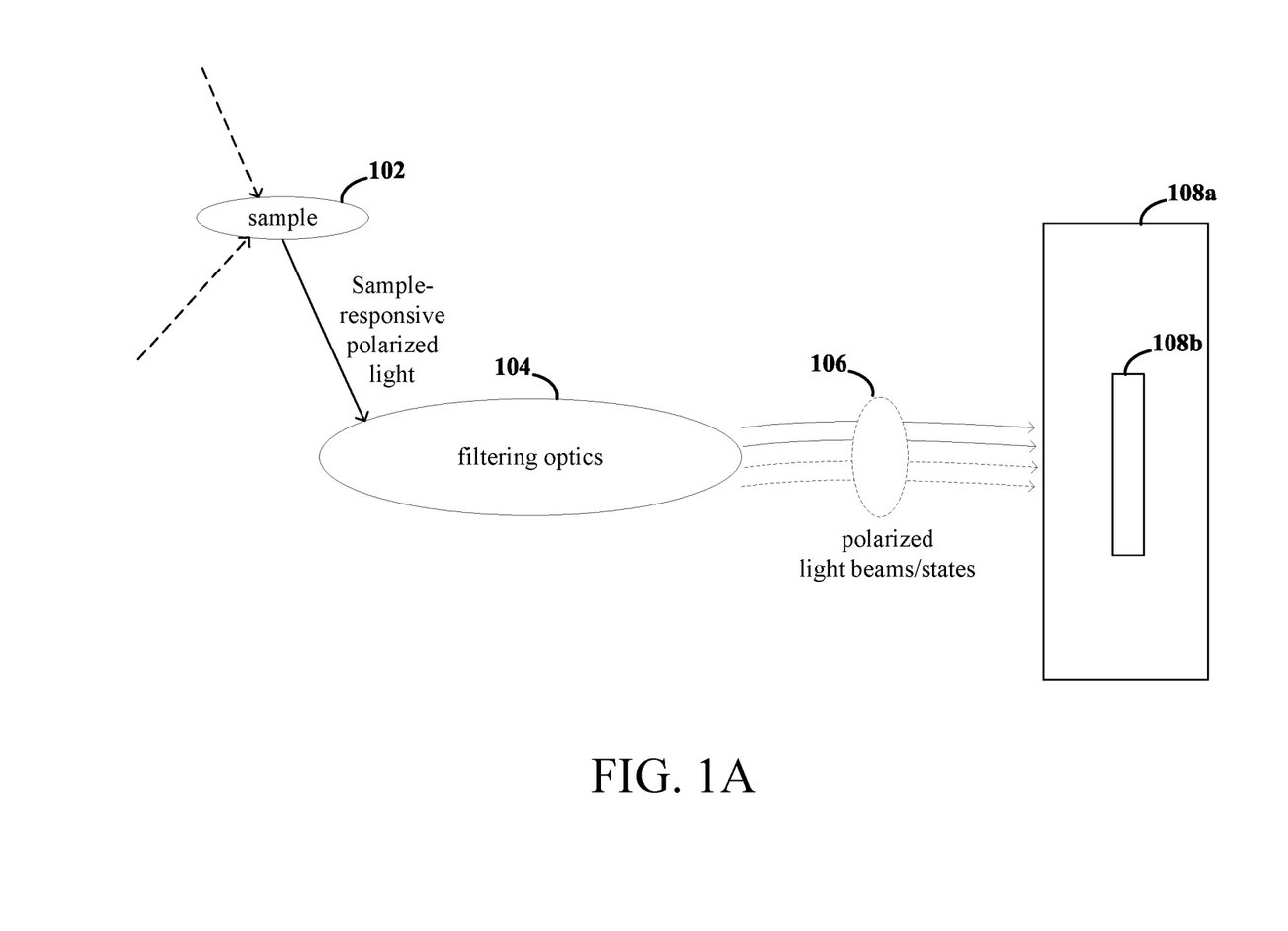
FIGS. 1A, 1B and 1C depict examples of systems directed respectively to: polarization optics and light-field hyperspectral imaging (including an optional logic circuit) as in FIG. 1A; and more-specific alternative systems which may also include such optics and imaging as in FIGS. 1B and 1C respectively.
Figure 1B:
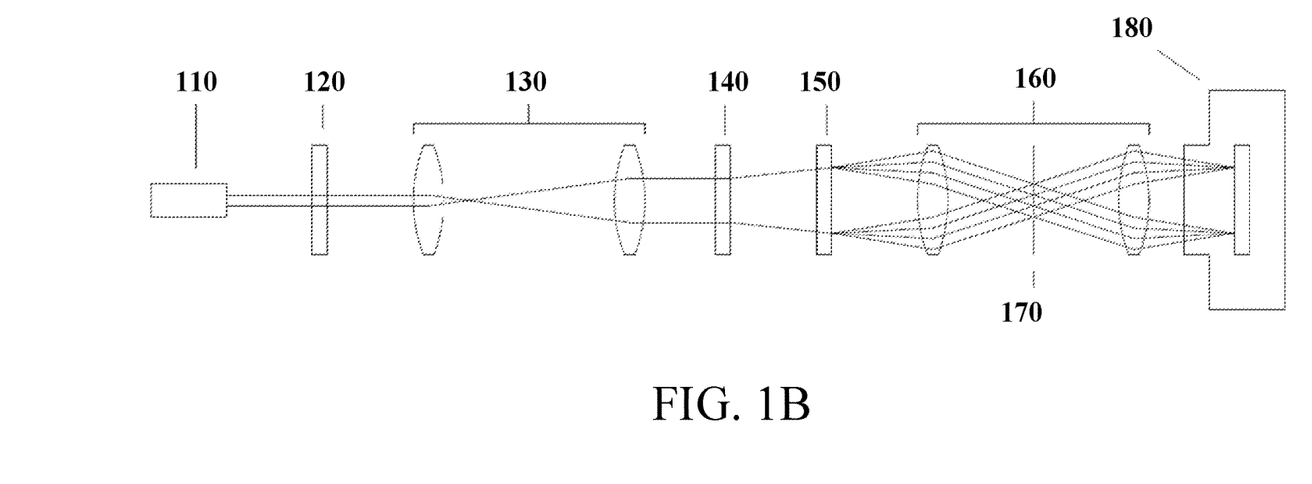
Figure 1C:
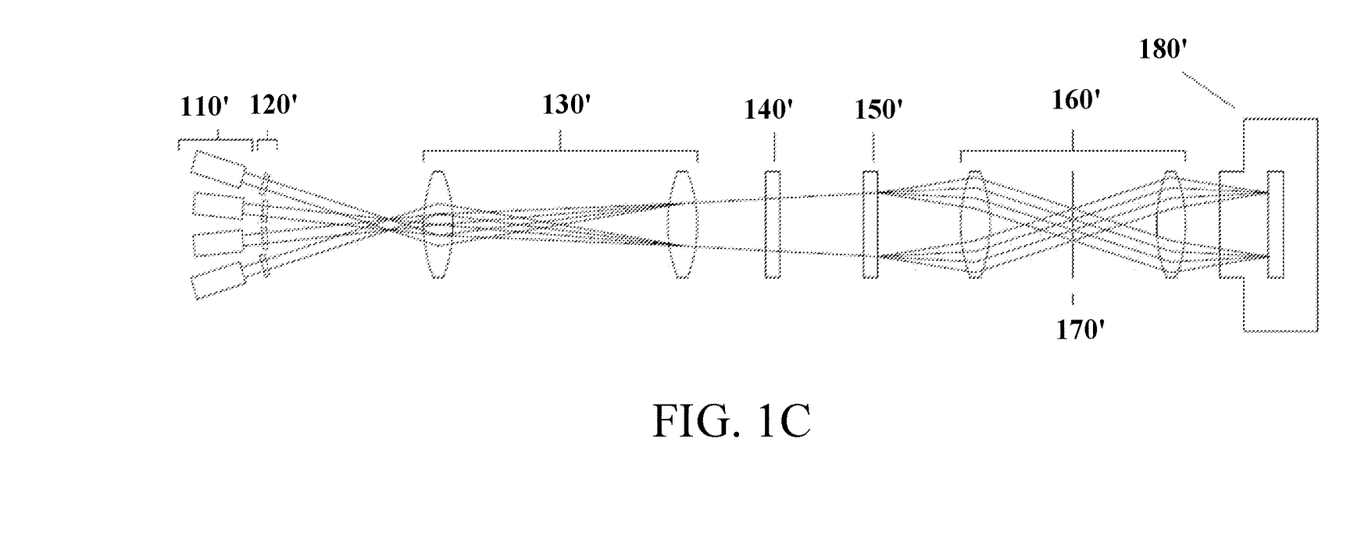

Turning now to the drawing, FIGS. 1A, 1B and 1C depict imaging-polarimetry systems (e.g., assemblies, partial and/or complete systems) useful for detecting defects in semiconductor-related thin-film material, according to example implementations of the present disclosure, which use optics and light-field imaging to capture or characterize a portion of a sample of semiconductor-related material such as thin-film material which is responsive to certain polarized light. In FIG. 1A, such a sample is depicted as 102 and filtering optics 104 (and optionally optics 106) which are configured to manipulate the polarized light responsive to the sample. After processing by such filtering optics, the polarized light is observed or captured by a detector 108a-108b (generally as "detector 108"), for example, having light-angle-processing aspects and a digital/pixel-based camera 108b.

The detector 108 may be configured to provide a set of such light-responsive data based on one, two or more factors associated with the processing by the filtering optics 104/106. In a specific approach, these factors may include: sets of polarization-state values respectively associated with the filter-separated ones of the different polarization states, different wavelengths associated with the different polarization states, and incidence angles of light arising or caused by further processing of the filter-separated ones of the different polarization states. With such a system's use of one or more of these factors, it is appreciated that in various embodiments, these components may contribute to developing one or more of the above-noted factors (e.g., sets of polarization-state values, wavelengths associated with the polarization states, and light-incidence angles characterizing separation of the different polarization states). Importantly, based on such factors, different types and severities of anomalies in semiconductor-related thin-film materials may be analyzed and the related defects remedied.

It should be appreciated that aspects of the above type of polarimetry-measurement approach may be the whole or part of a system-applicable kit, which is also according to certain aspects of the present disclosure. For example, the kit may have one or two devices, such as a logic (computationally-enabled/CPU) circuitry and/or a memory device. Such logic circuitry may be used for data processing and computation in processing a sample's optical response which, by use of the example shown in FIG. 1A, can be mathematically described via a 4×4 matrix. In a Mueller matrix, for example, each entry of the 4×4 matrix may be used to represent how the sample changes a particular input polarization into a particular output polarization. Once the sample response data is captured and/or further characterized as such, the data may be stored on such a memory device. The memory device may store data associated with the sample-characterizing response data (e.g., relating to the one or more above-characterized factors). The memory device, which refers to or includes a non-transitory data-storage medium, may be accessed (written to and/or read from) by the logic (computationally-enabled/CPU) circuitry or another logic/CPU circuit for any of a variety of purposes or applications, many of which are further discussed herein.

According to example aspects and implementations consistent with the systems disclosed in connection with FIGS. 1A, 1B and 1C, such a matrix can be acquired at all points on such a thin-film sample of semiconductor-related material with a single image capture. This aspect, along with others, will become more apparent from the more-specific aspects illustrated and discussed in connection with specific alternative-implementation examples shown in FIGS. 1B and 1C.

As with the above discussion, according to yet other exemplary aspects the present disclosure is directed to any one or more components or parts illustrated and/or discussed in connection with FIG. 1B and FIG. 1C with configuration and/or intended use directed to defect-related detection in semiconductor-related thin-film material. These illustrated components or parts are depicted using similar reference numerals to depict similar types of components or parts. For example, FIG. 1B uses reference numerals 110, 120, 130, . . . 180 to depict certain components or parts, and FIG. 1C uses reference numerals 110', 120', 130', . . . 180' to depict certain components or parts which are constructed and/or are to operate similarly. Further, certain of the components or parts of FIGS. 1B and 1C may correspond to or provide examples of the type of device more generally depicted in FIG. 1A (e.g., filtering optics 104/106 may refer to or include PSA 160/106', and the detector 108 may refer to refer to or include 180/180').

In a specific example using either of the alternative systems of FIGS. 1B and 1C for detecting defects in semiconductor-related thin-film material, a light source 110/110' creates light that passes through certain optics in the form of a polarization state generator (PSG) 120/120'. The light source in FIG. 1B provides a set of paired light beams, whereas the light source in FIG. 1C provides (four) sets of pair light beams. In either case, the set or sets of PSG-generated light may be expanded through expansion optics 130/130' and passed through a diffuser 140/140' in order to evenly illuminate the entire sample of semiconductor-related thin-film material (such as sample 102 of FIG. 1A). As shown, the sample 150 is located to pass as opposed to reflect the polarized light beams in this particular example, although the systems depicted in FIGS. 1A-1C contemplate the polarized light reflecting from such a sample as discussed above. The light then passes through a set of imaging optics 160/160' which contains a polarization state analyzer (PSA) 170/170'. The light is then recorded on a detector (or camera) 180/180'.

In connection with one or more of the examples provided in connection with FIGS. 1A, 1B and 1C, the light source 110/110', PSG or optics 120/120', PSA 170/170', and detector 180/180' are described below. In order to accommodate single-shot acquisition of the Mueller matrix, the input light source consists of several different polarization states multiplexed on different wavelengths. This may be accomplished by a PSG, as shown by way of FIGS. 1B and 1C, which may be implemented in various ways.

Figure 2:
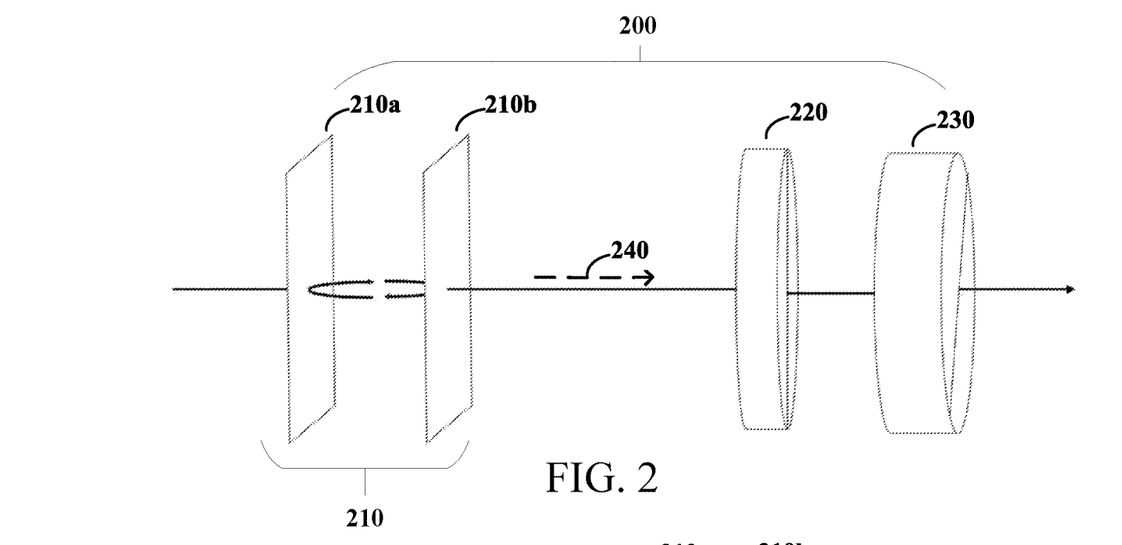
FIG. 2 is an example of a PSG (Polarization state generator) with Fabry-Perot cavity, as may be used in conjunction with the above-noted apparatuses and/or systems, also in accordance with the present disclosure.
Figure 3:
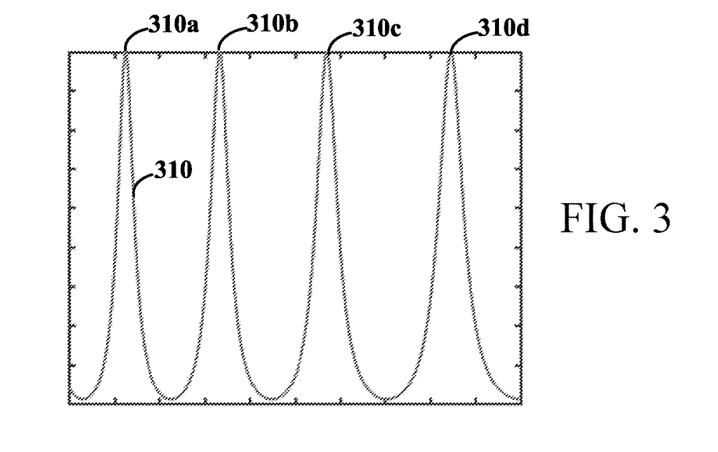
FIG. 3 illustrates a typical Fabry-Perot spectrum as may be applicable to the exemplary PSG of FIG. 2 for examples of apparatuses and/or methods in accordance with the present disclosure.

Yet another example implementation for a PSG has the PSG configured with a cavity to filter out desired wavelength channels from the output of a broadband light source. FIGS. 2 and 3 show aspects of such an example implementation wherein an illustrated PSG 200 includes a specific type of cavity 210, referred to as a Fabry-Perot cavity and including two parallel-reflecting surfaces 210a and 210b. The optical cavity 210 permits optical waves to pass through the cavity only when they are in resonance within the cavity.

The cavity may be used as an optical filter to filter out desired wavelength channels in response to such light output from a broadband light source. FIG. 3 shows a typical output spectrum 310 for such a PSG, which the illustrated output spectrum of the PSG is shown to include four distinct peaks 310a, 310b, 310c and 310d within the operating wavelength range. This operating wavelength range thereby permits for four wavelengths to pass through a linear polarization filter, as may be implemented by the cavity 210 and two multi-order waveplates 220 and 230 which follow the cavity 210 in the optical light path 240. In the example illustrated in FIG. 2, the two multi-order waveplates 220 and 230 may be placed at 45 degree angles relative to each other. Such a linear polarization filter is one example of optics which may form or refer to optics 104/106 of FIG. 1A.

Figure 4:
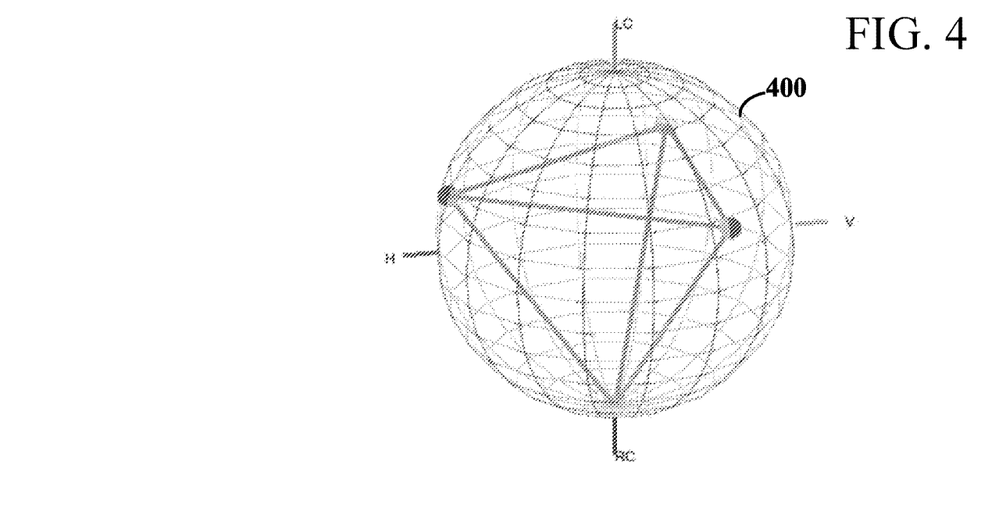
FIG. 4 is an illustration of a Poincare sphere with optimal polarizations as may be applicable to the exemplary aspects of FIGS. 1A-1C, also in accordance with the present disclosure.

According to another specific aspect of the present disclosure, the thickness of the waveplates 220 and 230 may be designed in such a manner to generate four polarization states that are well-spaced across a Poincare (or Poincare) sphere 400, which sphere is shown in FIG. 4. The Poincare sphere 400 may be used to characterize the polarization states of light represented via respective unique points on the surface of such a sphere. The optimal polarization states form a tetrahedron inscribed in the Poincare sphere.

As discussed above, an alternative system implementation for detecting defects in semiconductor-related thin-film material is illustrated in FIG. 1C. This alternative system involves use of a different type of PSG. The type of PSG shown in FIG. 1C uses as input light, light from the light source 110' which is provided in the form of four paired narrowband sources, each pair with its own set of polarization optics 120'. In this manner, each beam is a different wavelength and polarization and a setup of dichroic mirrors is used to combine the different beams into a single beam that contains four polarizations appropriately multiplexed on four different wavelengths. The output of the PSG can be described using Stokes vectors and the optimal polarization basis should be chosen to minimize the condition number of the matrix describing all four Stokes vectors. A lower condition number yields a high robustness to sources of noise throughout the instrument. The light generated by the PSG then passes through the sample. This can be performed in either transmission or reflection mode to image the corresponding Mueller matrix.

Figure 5:
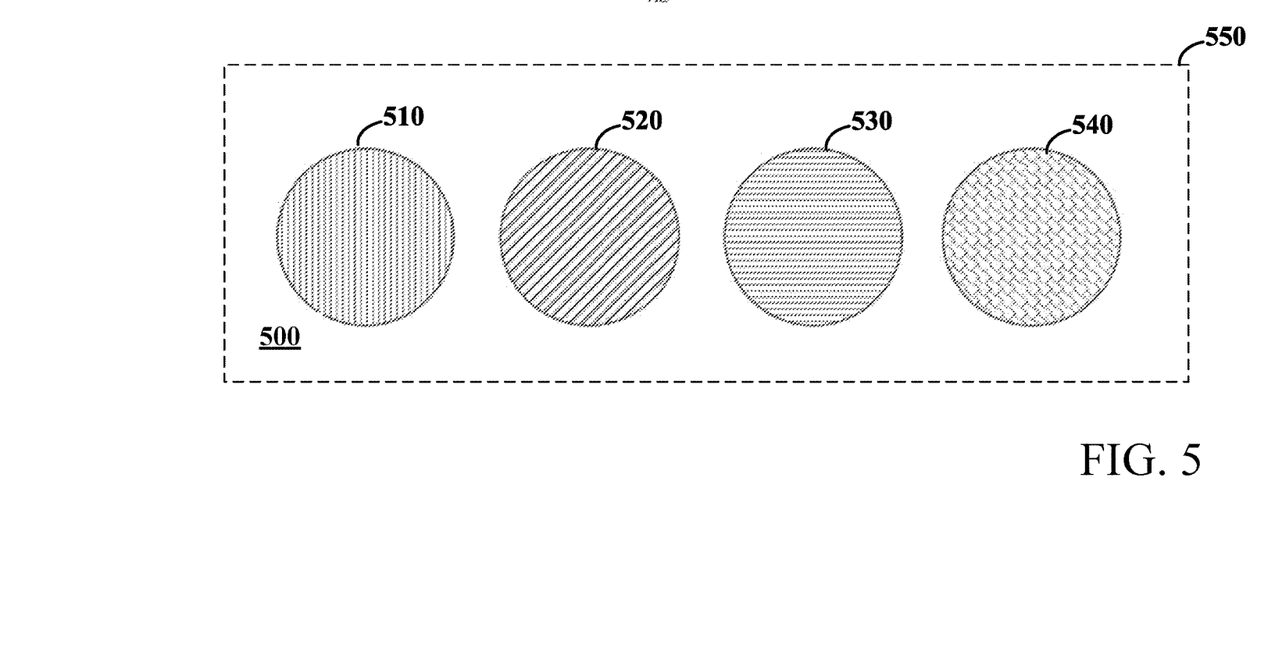
FIG. 5 is a set of top views of four polarization metasurface apertures, in accordance with the present disclosure.

The transmitted or reflected light may then be passed through a polarizing metasurface aperture structure (e.g., as a form of a polarization state analyzer or PSA), and, in response, collected by an imaging lens (e.g., as part of a detector). FIG. 5 shows, from a top-down perspective, another optical device including or referring to a metasurface aperture structure 500 including four polarization selective metasurfaces 510, 520, 530 and 540. Such metasurfaces may be placed adjacent to each other such as on a single substrate (the relevant part of which is shown as 550 in FIG. 5). The metasurfaces are small enough that the output beam impinges on all four devices simultaneously. Each metasurface is designed to fully transmit a desired polarization "P" while reflecting or absorbing the orthogonal polarization. The metasurface aperture structure 500 is designed and optimized in such a manner that this behavior can be performed over a bandwidth that is to cover the previously-discussed four operating wavelengths as well as a cone of incidence angles that arise from the imaging process.

Figure 6:
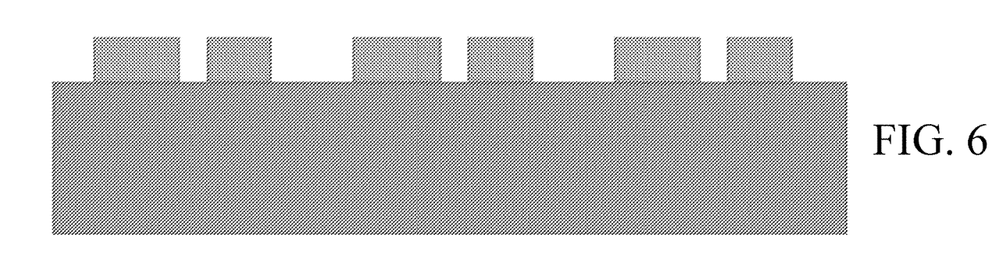
FIG. 6 is a cross-sectional view of a metasurface, in accordance with the present disclosure.
Figure 7:
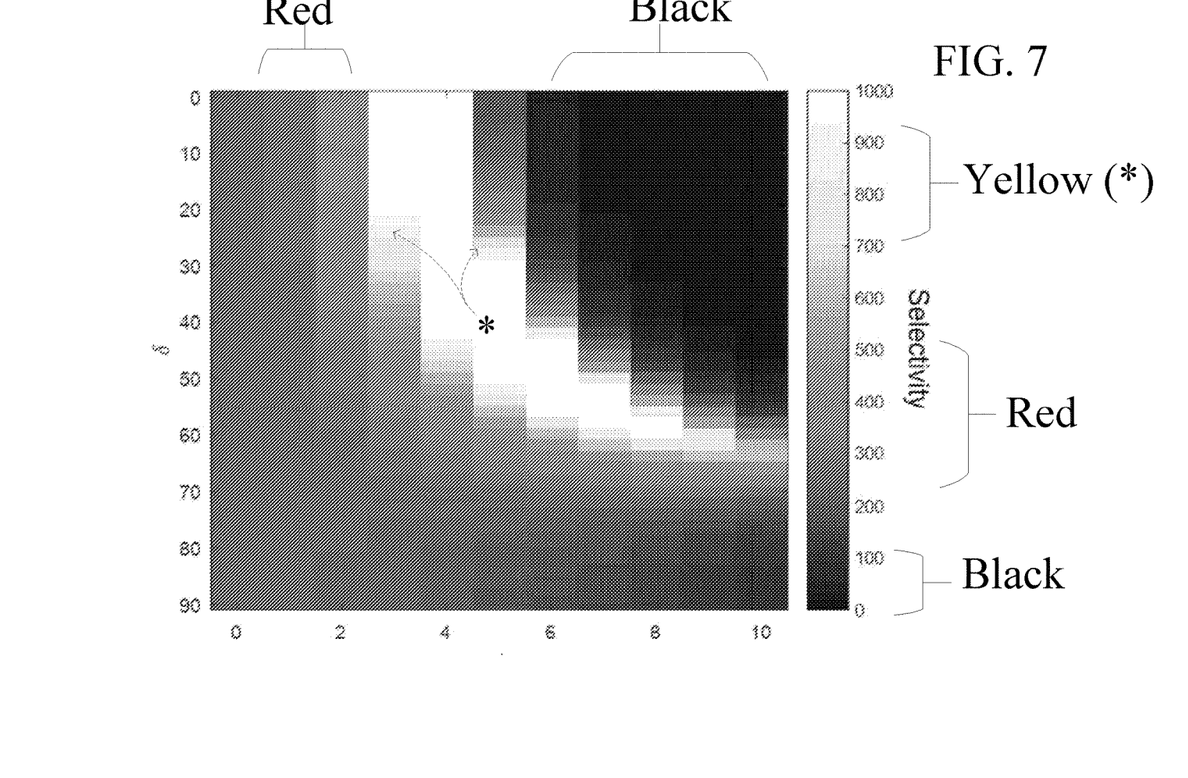
FIG. 7 is a plot showing angular performance of the linear polarizing metasurface, such as the type of metasurface structure exemplified in FIG. 5 and/or FIG. 6; in accordance with the present disclosure.

Relating to a figure of merit for describing performance of a detailed experimental metasurface structure in connection with such implementations according to the present disclosure, FIG. 6 shows a plot (in bar-graph form) of the selectivity of a metasurface polarization filter across a wide cone of incidence angles, whereas FIG. 7 shows the angular performance based on such a linear polarizing metasurface. The horizontal axis of FIG. 7 shows the sent angle of the light and the left-side vertical axis of FIG. 7 shows the light rotation. The figure of merit describing the metasurface performance in connection with this experimental implementation is selectivity, as depicted along the right-side vertical axis of FIG. 7. This selectivity may be referred to as the transmission of the desired polarization divided by the transmission of the undesired polarization. For certain designs, high selectivity may be more important to the polarimetry process than pure high efficiency.

In such implementations using such a metasurface-based structure, the metasurface structure may include and/or consist of (depending on the implementation) a nanostructured film on a transparent substrate. The nanostructures may include any or a combination of various geometries (such as bars, rectangular pillars, or freeform optimized structures) and the metasurface materials may be fabricated using dielectrics such as silicon, silicon nitride, or titanium dioxide, with metals such as gold, aluminum or silver, or various polymers. The substrate (e.g., 550 of FIG. 5) may be or include a transparent material (so as to provide sufficient transparency to pass the light and reveal the incidence angles) such as silicon dioxide. Alone, each of the polarizing metasurfaces (e.g., 510-540) filters out a specific polarization, but in tandem the four metasurfaces (each filtering a different polarization) form a basis of polarization states for measuring the Stokes vector and may serve as the PSA. As with the PSG, the set of polarization states for such a PSA may be chosen in order to maximize the noise tolerance in the measurement. According to one specific/experimental implementation, at this stage: (a) the output Stokes vector may be encoded in the physical aperture location, (b) the input polarization state may be encoded in the different wavelengths and (c) the image may be stored in a cone of incidence angles. As noted previously, one or more or all of these factors may be used to characterize a sample's response to passing and/or reflecting the polarized light as depicted in connection with FIGS. 1A, 1B and 1C.

Figure 8:
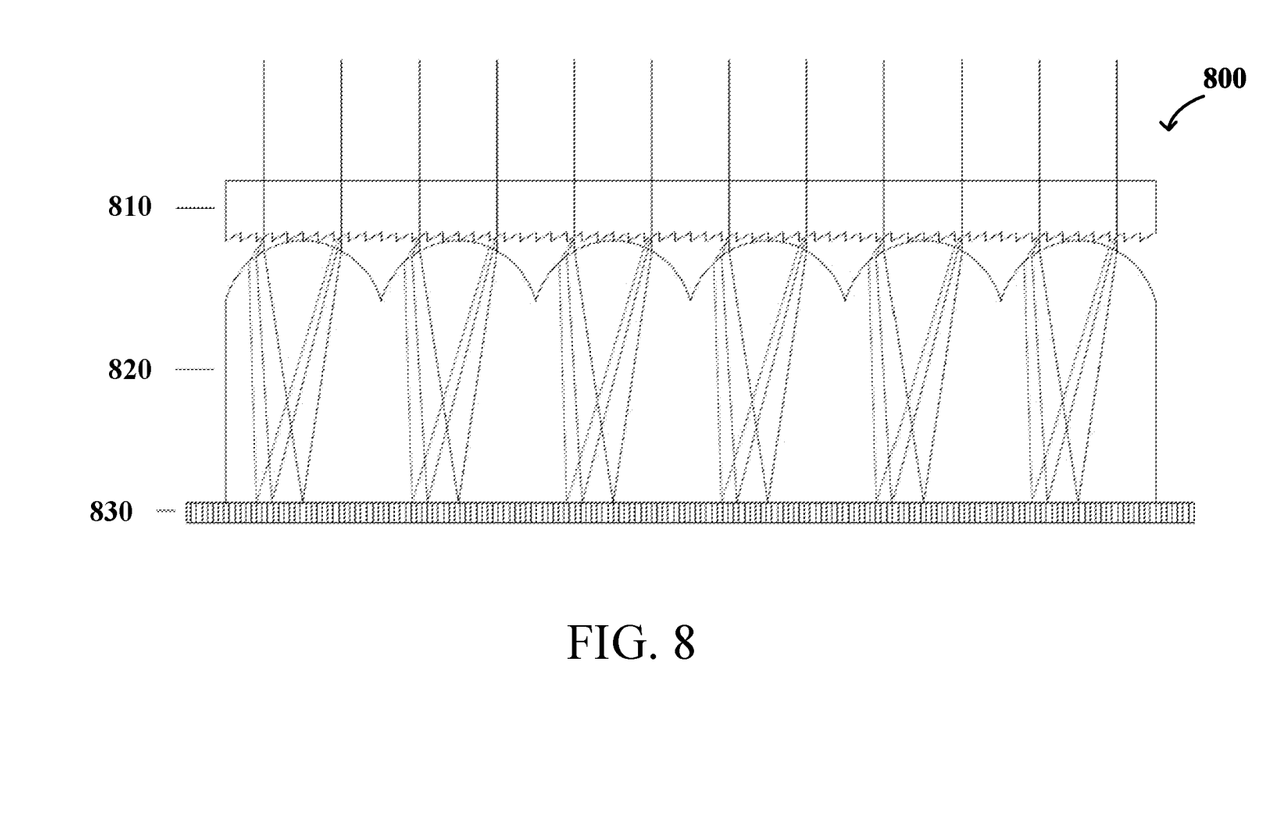
FIG. 8 is an illustration of a lightfield module, in accordance with the present disclosure.

FIG. 8 shows relevant aspects of a detector 800, as another aspect of the present disclosure, which may be a hyperspectral light-field detector module configured to perform the task of decoding the information dense light beams. The detector 800 may include a diffraction grating 810 mounted directly on top of a microlens array 820 which is then mounted directly on top of an image sensor 830. Each microlens in the microlens array serves as a large pixel(s), with the entire array able to record an image. Under each microlens there are many pixels of the underlying image sensor which will record different aspects of the samples polarization state. The microlens array further serves as a light field camera, imaging the set of four apertures onto unique pixels under each microlens. Thus, at each pixel the information to recover the output Stokes vector (set of values that describe the polarization state) appears as a row of four points such as the four point depicted at 905 of FIG. 9. The mounted diffraction grating splits the light into different wavelengths (consistent with the input polarizations) along the direction perpendicular to the apertures. The final result is a 4×4 grid of subpixels containing the measurements necessary to reconstruct the Mueller matrix at that pixel, as depicted for example, in connection with the four rows 910, 920, 930 and 940 of FIG. 9. Each illustrated row is shown with its point being pixel-aligned with a respective one of the different wavelengths (and its respective one of the four distinct peaks 310*a*, 310*b*, 310*c* and 310*d* of FIG. 3). Various types of known grating structures may be used in this regard and including for example, closely aligned and various configurations of quarter wavelength grating structures.

After detection, the image is de-mosaicked (unpacked) in order to reconstruct sixteen images that each represent a single measurement. Then, at each pixel, the Mueller matrix can be computed from the measured intensities. This set of inexpensive computations is then performed at each pixel to compute the Mueller matrix across the entire image. Based on such computation and any related sample response data, the types and severities of such anomalies in the semiconductor materials may be analyzed and/or the related defects remedied.

Figure 10A:
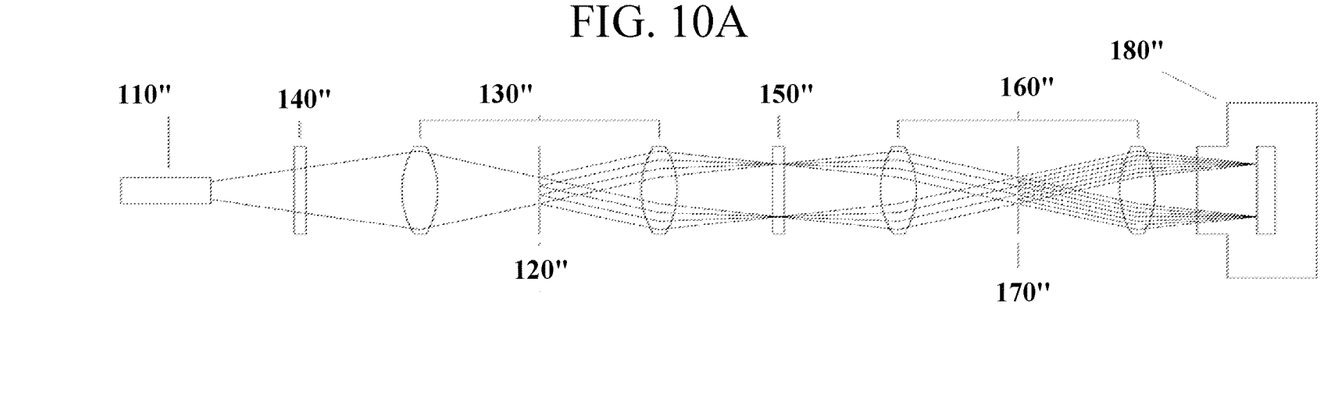
FIG. 10A depicts yet another type of detailed example system, as an alternative to the detailed example systems shown in FIGS. 1B and 1C, also involving polarization optics and light-field hyperspectral imaging, also according to the present disclosure.

Consistent with many of the above discussed aspects and also according to the present disclosure, FIG. 10A depicts yet an alternative example system for detecting defects in semiconductor-related thin-film material with polarimeter-layout details being shown in a manner similar to that shown in the examples of FIGS. 1B and 1C. As with each of the systems of FIGS. 1A, 1B and 1C, FIG. 10A is also capable of single-image capture of the entire polarization state for all wavelengths of illumination across the entire sample. The system illustrated in FIG. 10A may also use a Mueller-type matrix and Mueller-type spectro-polarimetry as discussed above in connection with the previous example embodiments. The system of FIG. 10A, however, is different from certain of the previously-discussed designs where the wavelength is used to encode polarization. As shown in FIG. 10A, the polarization is encoded by the optical design and the wavelength is free to provide additional measurement data. The reference numerals used to label aspects in FIG. 10A correspond to the same or similar elements as may be recognized in the previous system designs, but some are located in different locations.

FIG. 10A shows light from the source 110" passing through a diffuser 140" to homogenize the illumination before a sample 150" of semiconductor-related material. After the diffuser 140", the optical path includes a beam expander 130", which may include a PSG (polarization state generator) 120". The PSG 120" includes or consists of four different apertures to encode four input polarization states. Exiting the beam expander 130", each of these input polarizations hits the sample (under test) 150" at a slightly different angle. In certain implementations, these optical elements may be integrated into the same optical unit, for example, as shown with the PSG 120" inside the beam expander 130" as separate components.

The light enters the imaging optics 160" where a polarization state analyzer (PSA) 170" is located. The PSA 170" may include or provide sixteen different apertures, each producing a different output polarization state. In response to such processing by the PSA 170", the light in these channels (each corresponding to one of the sixteen different output polarization states) hits the hyperspectral light-field detector 180" (aka camera or image sensor), which analyzes and decodes the information similar to the previous discussion.

Accordingly, advantages of this configuration include, among others, that in the apparatus or system of FIG. 10A, wherein the different wavelengths are not needed and in some instance are not used to encode polarization, and/or the polarization is encoded by certain optics elements used in the apparatus (e.g., beam expander 130"), the wavelength may be used (and in some instances is used) to provide additional measurement data associated with the sample. In other example implementations involving such mathematical-matrix (or Mueller-matrix) based polarimetry, it may be appreciated that various optics-related aspects discussed and/or illustrated with the above example embodiments may be used to modify (e.g., augment or replace) the optics elements discussed and/or illustrated in connection with FIG. 10A, and that in certain implementations subassemblies of such discussed and/or illustrated systems may be combined, for example, as products to be used with other optics elements.

As realized in an experimental application of the polarimetry system of FIG. 10A for such a test sample 150" of semiconductor-related thin-film material, light incident on the image sensor takes a distribution in which the wavelength information is distributed vertically onto the pixels. The encoded polarization states are distributed horizontally onto the pixels, with the four input polarizations being divided into four large groups. For each input group, the four output polarizations are imaged into four vertical lines of pixels adjacent one another, where each line of pixels represents the Mueller matrix of the sample taken at a particular wavelength.

Figure 9:
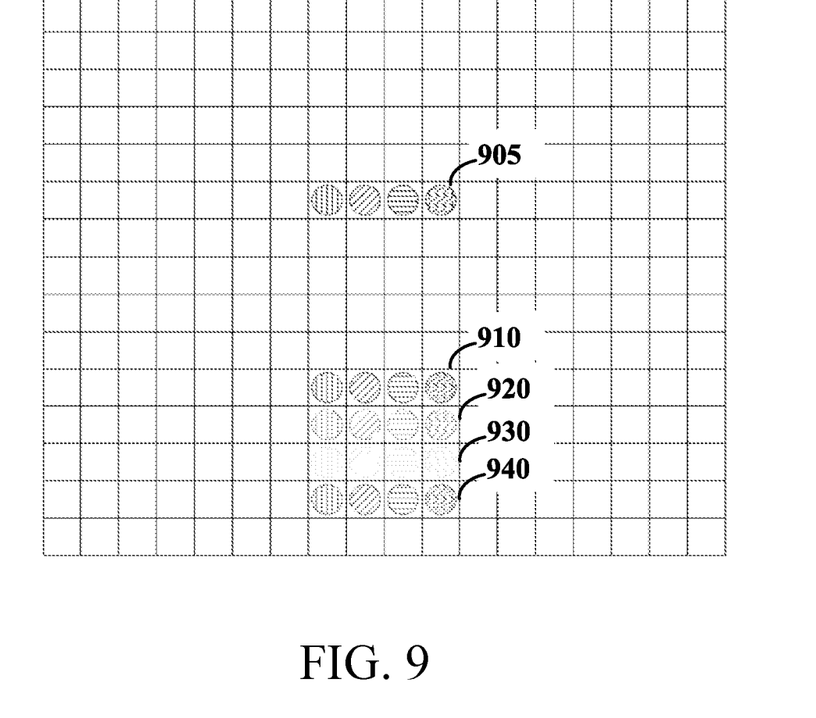
FIG. 9 is a graph illustrating plots to show the projection under each microlens onto an image sensor in accordance with such example embodiments and exemplary aspects of FIGS. 1A-1C, also according to the present disclosure.
Figure 10B:
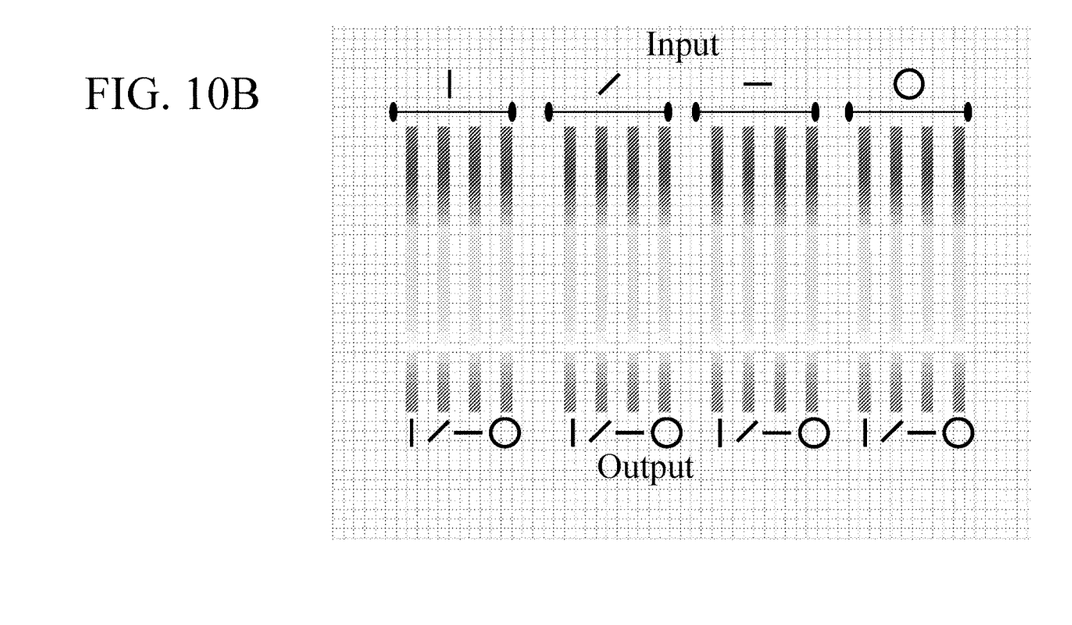
FIG. 10B depicts a schematic for an image sensor, according to the present disclosure, used in the system of FIG. 10A.

Further in connection with this experimental application, the image sensor produces a raw image output such as shown in FIG. 10B (as an expansion of what is shown in the schematic of FIG. 9). FIG. 10B serves to permit clear visualization of the groups of four vertical lines, where each line is a different polarization state taken over a spectrum of wavelengths. As would be recognized in a color version of FIG. 10B, a spectrum of colors is similarly shared by each of the sixteen vertical lines (four groups of four vertical lines), with the colors transitioning from the top (input side) towards the bottom (output side). Using this perspective, the colors of each vertical lines are as follows from top to bottom: purple, blue, aqua, lime, yellow, orange and finally red.

In connection with more specific details, the system of FIG. 10A is useful for characterizing anomalies of different types of semiconductor material samples, for example, by comparing respective processed-output images of the Mueller-type polarimeter of any of FIGS. 1A, 1B, 1C and FIG. 10A, and then categorizing similar and dissimilar attributes of the images while tracking performance-related criteria of the semiconductor devices so to ascertain which anomalies associated with the different types of semiconductor material are problems which need to be remedied.

Many of the above systems and methods, as disclosed in accordance with the present disclosure, permit but do not require more complex aspects such as: optical setups to perform imaging Mueller-matrix related polarimetry for measurements which are time sequential (i.e., multiple measurements made in sequence to obtain response characterization data); and spatial Fourier domain processing (which is prohibitively slow for many applications requiring high speed processing). Moreover, such complex aspects (e.g., Fourier domain imaging) necessitate redundant information captured on the image sensor, which may significantly reduce the efficiency of the design.

Further, and in accordance with the present disclosure, many of the above-disclosed systems and methods may use only a simple matrix multiplication to compute the Mueller matrix, and may additionally use microlenses which concentrate light, rather than spreading it, to increase the signal to noise ratio of the measurement. From a commercial perspective, Mueller polarimeters may be custom built or acquired such as from Hinds Instruments (e.g., Exicor 150XT is a commercially-available single-point Mueller polarimeter utilizing photoelastic modulators to capture the Mueller matrix). While the measurement of each individual point is relatively fast due to the high-speed nature of the photo-elastic modulators, the beam is to be scanned across the sample making measurements of images very slow.

Other examples of the present disclosure may involve the above-described aspects used in combination with certain of the tools and processes, as would be recognized by the skilled artisan, disclosed previously in publications such as U.S. patent-related documents identified by U.S. Pat. Nos. 4,306,809, 6,175,412, and Publication No. 2011/0205539. Consistent with the above aspects, certain apparatuses and methods according to the present disclosure may involve aspects disclosed in the above-referenced U.S. Provisional Applications, such as for further information regarding examples and construction details for implementing the above-discussed metasurfaces and/or metasurface-aperture structures (e.g., as in connection with FIG. 5). To the extent permitted, such subject matter is incorporated by reference in its entirety generally and to the extent that further aspects and examples (such as experimental and/more-detailed embodiments) may be useful to supplement and/or clarify.

The skilled artisan would also recognize various terminology as used in the present disclosure by way of their plain meaning. As examples, the Specification may describe and/or illustrates aspects useful for implementing the examples by way of various materials/circuits which may be illustrated as or using terms such as layers, blocks, modules, device, system, unit, controller, and/or other circuit-type depictions. Also, in connection with such descriptions, the terms "optics" and/or "optical element(s)" refers to or includes any of a variety of different types of light-manipulating structures, examples of which are discussed and/or illustrated in connection with the above examples (such as in FIGS. 1A, 1B, 1C and 10A); other examples of optical elements include metasurfaces, metastructures, faceplates, lenses, prisms, mirrors, and parts of or the whole of optical scope systems, and optical fiber systems. Such materials (including portions of certain structures and/or layered structure) and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Further, while the above discussion refers to certain exemplary optical-related systems and structures in connection with experimental and/or proof of concept apparatuses by use of a mathematical (Mueller-like) matrix, variations of such systems and aspects may include use of another type of scattering matrix (modifications of the Mueller and Jones matrices, and/or other matrices that may multiply Stokes vectors) and/or involving procurement of one or more less-than-comprehensive representation of the polarization-related properties associated with a sample under evaluation or test. As more specific examples, it may not be necessary to illuminate the entire sample and/or homogenize all the illumination directed to the sample, and for characterizing a sample's response certain implementations may modify the optics such that not all the information is processed or available as described in connection with one or more of the above example embodiments. Such modifications do not depart from the true spirit and scope of various aspects of the disclosure, including aspects set forth in the claims.

What is claimed:

1. A method for detection of anomalies in semiconductor thin-film materials, the method comprising:
   using filtering optics, including a microlens array stacked with a diffraction grating, to provide a set of filter-separated light beams respectively associated with different polarization states of polarized light directed towards a sample of semiconductor thin-film material;
   providing a set of sample-characterizing response data, by passing light through the filtering optics towards an image sensor, which characterizes the sample of semiconductor thin-film material relative to distinct pixels defined by microlenses in the microlens array, based on at least two of the following: (a) sets of polarization-state values respectively associated with the filter-separated ones of the different polarization states, (b) different wavelengths associated with the different polarization states, and (c) incidence angles of light arising from or caused by further processing of the filter-separated ones of the different polarization states; and
   analyzing, in response to the step of providing a set of sample-characterizing response data, the semiconductor thin-film material.

2. The method of claim 1, wherein the set of sample-characterizing response data is sufficient to compute or populate a mathematical matrix for light-response characterization of the sample.

3. The method of claim 2, wherein the mathematical matrix is a Mueller matrix, and further including computing the Mueller matrix across an entire image, the image being captured in a single shot in response to using filtering optics which includes use of metasurface polarization filtering to provide the set of filter-separated light beams.

4. The method of claim 1, wherein the sets of polarization-state values correspond to or are associated with Stokes vectors.

5. The method of claim 1, further including capturing or detecting of the set of filter-separated light beams in response to said using filtering optics, wherein the captured or detected set of filter-separated light beams are sufficient to accommodate a single-shot acquisition of a Mueller matrix.

6. The method of claim 1, wherein using filtering optics includes use of four polarization-selective metasurfaces adjacent to each other on a single substrate, and wherein each of the metasurfaces is sufficiently small that the polarized light impinges on the four polarization-selective metasurfaces concurrently or simultaneously.

7. The method of claim 1, wherein using filtering optics includes use of multiple polarization-selective metasurfaces, each of the multiple polarization-selective metasurfaces fully transmitting a specific one of the different polarization states while reflecting and/or absorbing an orthogonal polarization that corresponds to the specific polarization state.

8. The method of claim 7, further including capturing data associated with the incidence angles of light, wherein the multiple polarization-selective metasurfaces include N different polarization-selective metasurfaces, each of which is used over a bandwidth that covers N corresponding operating wavelengths and is used over a cone of the incidence angles, where N is an integer greater than one.

9. The method of claim 1, further including image-capturing the incidence angles of light in real time via a single image capture.

10. The method of claim 1, wherein the different polarization states correspond to a number, which is more than two and less than a dozen, of polarization states multiplexed on different wavelengths via a polarization-state generator (PSG).

11. The method of claim 1, further including: directing the polarized light towards the sample; using a polarization-state generator (PSG) to process the light into different channels; and wherein the filtering optics to provide the set of filter-separated light beams is part of a polarization-state analysis carried out by the PSG.

12. The method of claim 1, wherein the filtering optics includes a light-field detector having the microlens array between the diffraction grating and an image sensor.

13. The method of claim 1, wherein at each pixel, among the distinct pixels, sufficient information is provided for recovering an output set of values that describe a polarization state associated with the pixel.

14. The method of claim 1, wherein the diffraction grating splits the light into different wavelengths, and the microlens array acts as a light field camera.

15. The method of claim 1, wherein the set of sample-characterizing response data is based at least in part on the sets of polarization-state values respectively associated with the filter-separated ones of the different polarization states.

16. The method of claim 1, wherein the set of sample-characterizing response data is based at least in part on the different wavelengths associated with the different polarization states.

17. The method of claim 1, wherein the set of sample-characterizing response data is based at least in part on the incidence angles of light arising from or caused by further processing of the filter-separated ones of the different polarization states.

18. The method of claim 1, wherein the set of sample-characterizing response data is based on the (a) sets of polarization-state values respectively associated with the filter-separated ones of the different polarization states, (b) different wavelengths associated with the different polarization states, and (c) incidence angles of light arising from or caused by further processing of the filter-separated ones of the different polarization states.

19. The method of claim 1, further including generating a mathematical matrix, from measurements related to the set of sample-characterizing response data, indicative of optical responsiveness of the sample of semiconductor thin-film material.

20. The method of claim 19, wherein the mathematical matrix is generated, based on a single image capture ensuing from said passing light through the filtering optics towards the image sensor.

* * * * *